US006500498B1

(12) United States Patent
Ford et al.

(10) Patent No.: US 6,500,498 B1
(45) Date of Patent: Dec. 31, 2002

(54) METHOD FOR FABRICATING A MAGNETO-OPTIC MODULATOR

(75) Inventors: Carol M. Ford, Columbia Heights; Randy J. Ramberg, Roseville, both of MN (US)

(73) Assignee: Honeywell International Inc., Morristown, NJ (US)

( * ) Notice: Subject to any disclaimer, the term of this patent is extended or adjusted under 35 U.S.C. 154(b) by 239 days.

(21) Appl. No.: 09/639,552

(22) Filed: Aug. 16, 2000

Related U.S. Application Data

(63) Continuation of application No. 09/201,247, filed on Nov. 30, 1998, now abandoned.

(51) Int. Cl.[7] .......................... C23C 14/14

(52) U.S. Cl. .......................... 427/531; 427/58; 427/123; 427/126.3; 427/131; 427/132; 427/162; 427/523; 427/547; 427/598

(58) Field of Search .......................... 427/531, 58, 123, 427/126.3, 131, 132, 162, 523, 547, 598

*Primary Examiner*—Bernard Pianalto

(74) *Attorney, Agent, or Firm*—Dennis C. Bremer

(57) ABSTRACT

A method for fabricating a magneto-optic modulator, such as for use with a solid state ring resonator gyroscope. The method includes inducing a magnetic field at a substrate holder as a layer of magnetic material is being deposited on a substrate. The magnetic field helps to optimally orient the deposited magnetic material layer to improve the characteristics of the magneto-optic modulator. In addition to inducing a magnetic field, a low energy ion beam may be applied to optimize orientation. The method can be used to fabricate a magneto-optic modulator on a substrate containing a partially fabricated ring resonator without destroying previously fabricated components.

19 Claims, 2 Drawing Sheets

METHOD FOR FABRICATING A MAGNETO-OPTIC MODULATOR

This is continuation of application Ser. No. 09/201,247 filed Nov. 30, 1998, abandoned.

BACKGROUND OF THE INVENTION

Optical waveguides are presently being used for a number of applications including communications, interconnects between optical circuits, and certain optical resonator applications. For varying reasons, there are needs to have phase modulators associated with these optical waveguides. The phase modulators create selected phase shifts for any number of reasons. One particular instance where a phase modulator is necessary is in conjunction with an optical resonator. Additionally, there are numerous instances where phase shifts may be required, for example, in optical communication networks, or in conjunction with optical circuits.

Optical modulators of several types are presently used. Examples of these optical modulators include acousto-optic modulators, as well as electro-optic modulators. Acousto-optic modulators are devices wherein an acoustic wave traveling in a bulk medium is used to modulate an optical signal which is traveling in an associated medium. The disadvantage of acousto-optic modulators is their use of acoustic waves, or sound waves, which are fairly slow and require a large bulk medium to support their transmission.

Another type of modulator is a magnetic modulator. These modulators require the creation of some type of magnetic field which interacts with the optical signal traveling through the modulator. The interaction with the magnetic field alters the amplitude and/or frequency of the optical signal.

A third type of modulator is an electro-optic modulator wherein the optical signals interact with an electric field. The field interaction alters the characteristics of the optical signal, thus varying the frequency amplitude and/or phase of the optical signal.

All of the above-mentioned modulators require precise alignment of the differing components. Specifically, the modulator itself must be aligned and positioned to receive an incoming optical signal and must be situated to appropriately transmit an output optical signal. This alignment can often become very tedious and exacting work which is both time consuming and costly. Furthermore, the modulators require the use of specific materials (i.e., electro-optic materials, magnetic materials, and acousto-optic materials) which display the appropriate characteristics.

Also, many times the application of material on the modulators is uncontrollable. The composition as well as the amount of crystallinity has not been able to be controlled in the past. Further, in the magnetic modulators, the orientation of the magnetic axis of the material is poor and many times, improperly aligned which results in loss. It would be desirable to optimize the operation of the phase modulators by controlling material deposition and optimizing the alignment so that loss could be reduced as well.

SUMMARY OF THE INVENTION

It is an object of the present invention to provide a magnetic modulator and system of fabrication, such that the modulator exhibits very low losses and very high efficiency.

A further object of the present invention is to provide a system of fabricating a magnetic modulator which can be used in conjunction with the fabrication of other components on a single substrate. Specifically, it is an object of the invention to fabricate a magnetic modulator upon a substrate without destroying components which already exist on the same substrate.

Another object of the invention is to provide a system of fabricating a magneto-optic modulator which is capable of depositing the necessary thin films of magnetic materials.

The present invention provides a system for the fabrication of a magneto-optic modulator. The method can be used to easily and economically fabricate a magneto-optic modulator which is easily integrated into other devices. Furthermore, the present invention can be used to fabricate a modulator which is situated on a single substrate along with accompanying waveguides. The modulators fabricated are very efficient and high speed modulators. Furthermore, due to the materials used and the purity/consistency of the materials, very low power is required to achieve the necessary modulation.

In accordance with the above-mentioned goals and objectives, the magnetic modulator of the present invention is fabricated using the processes of ion beam and magnetron deposition. It is now possible to use these processes to fabricate thin films of magnetic materials having the necessary magneto-optic characteristics to form a magneto-optic modulator. The deposition processes can be used at differing points in the fabrication of optical devices because the deposition processes are non-destructive methods of fabrication. More specifically, these methods of thin film deposition can be used to fabricate films on a single substrate without destroying previously fabricated structures that already exist upon that substrate.

DETAILED DESCRIPTION OF THE INVENTION

One application of a modulator fabricated using the process of the present invention is in conjunction with a ring resonator. A more specific application of the ring resonator is its use to measure rotation (i.e., a gyroscope).

Figure 1:
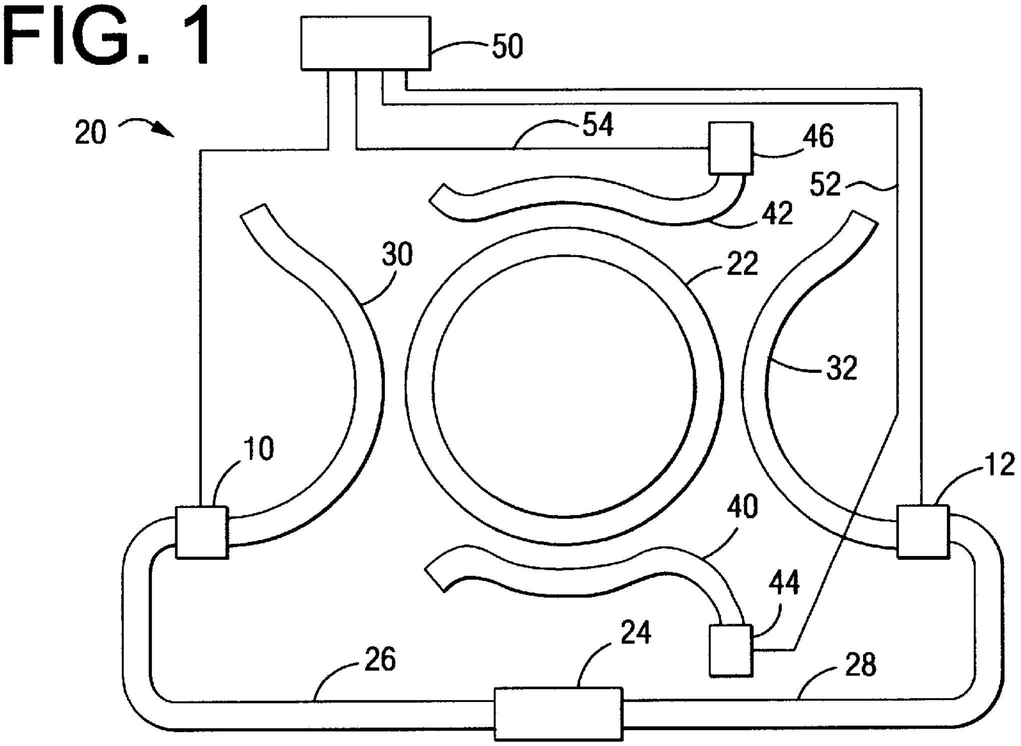
FIG. 1 displays one possible application for the magneto-optic modulator wherein the modulator is used in conjunction with a solid state ring resonator to sense inertial rotation.

Referring to FIG. 1, there is shown an application of a modulator 10 fabricated using the principles of the present invention. The solid state gyroscope 20 shown in FIG. 1 has an optical ring resonator 22 which supports two counter-propagating optical signals. Optical signals are provided to ring resonator 20 by an optical signal source 24. Optical signal source 24 may be a laser diode or other similar light producing device.

Optical signal source 24 provides two identical optical signals which are transmitted to a first modulator 10 and a second modulator 12 via a first waveguide 26 and a second waveguide 28, respectively. First modulator 10 and second modulator 12 receive the transmitted optical signal from optical signal source 24 and provide a modulated optical signal to a first optical coupler 30 and a second optical coupler 32. These modulated optical signals are then coupled into ring resonator 22 and thus counterpropagate therein.

Located adjacent to ring resonator 22 is a first detection coupler 40 and a second detection coupler 42. The counter-propagating optical signals which are resonating within ring resonator 22 are coupled into first detection coupler 40 and second detection coupler 42. The signal coupled into first detection coupler 40 is provided to a first detector 44 which is capable of sensing the received optical signal. Similarly, the optical signal coupled into second detection coupler 42 is communicated to second detector 46 which is also capable of detecting the characteristics of the received optical signal. In conjunction, first detector 44 and second detector 46 are then capable of sensing the characteristics of the two counterpropagating optical signals. More specifically, first detector 44 and second detector 46 are capable of detecting the frequency of the two optical signals counterpropagating within ring resonator 22. Electrical signals are produced by first detector 44 and second detector 46 which are indicative of their received optical signals. The electrical signal produced by first detector 44 is connected to a control means 50 via connection 52. Similarly, the electrical signal produced by second detector 46 is communicated to control means 50 via connection 54.

In summary, solid state gyroscope 20 detects rotation by detecting a shift in the resonant frequency of the optical signals counterpropagating within ring resonator 20. When ring resonator 22 sits stationery in inertial space, a set difference in frequency is produced between the optical signals so that the counterpropagating optical signals are less sensitive to each other's backscatter. Alternatively, when ring resonator 22 is rotated about its central axis, the resonant frequency of the optical signals resonating within ring resonator 22 is shifted. The resonant frequency in one signal will be increased while the resonant frequency in the other signal will be decreased. It is this shift in resonant frequencies which is indicative of rotation. First detector 44 and second detector 46 are used to sense this shift in resonant frequency. In response to the shift in resonant frequency, controller 50 provides appropriate signals to first modulator 10 and second modulator 12. These modulators can then shift the frequency of the optical signals being provided to ring resonator 20 and thus maintain equivalent difference in resonant frequencies in each direction. These frequency shifts create a closed-loop system wherein the resonant frequency of the optical signals within ring resonator 22 are maintained at a constant differential frequency and the amount of frequency shift required to maintain this equilibrium is indicative of rotation.

Figure 2A:
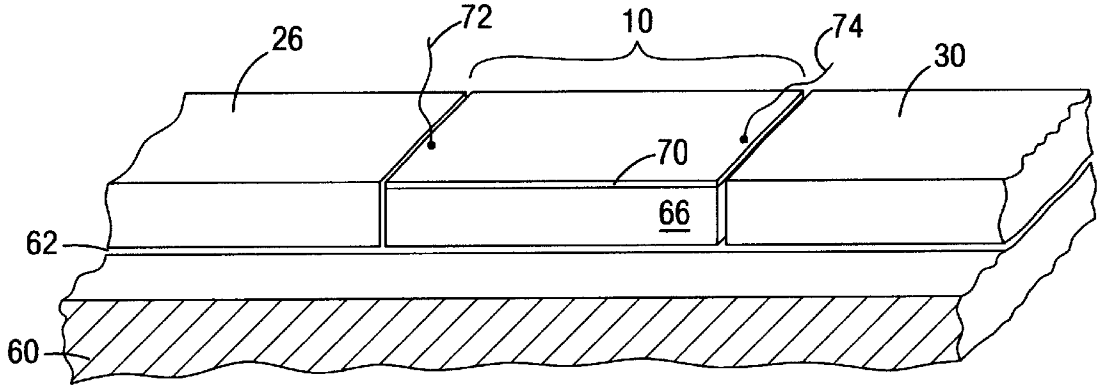
FIGS. 2*a* and 2*b* are a perspective view and a side view, respectively, of one embodiment of a magneto-optic modulator fabricated using the process of the present is invention.
Figure 2B:
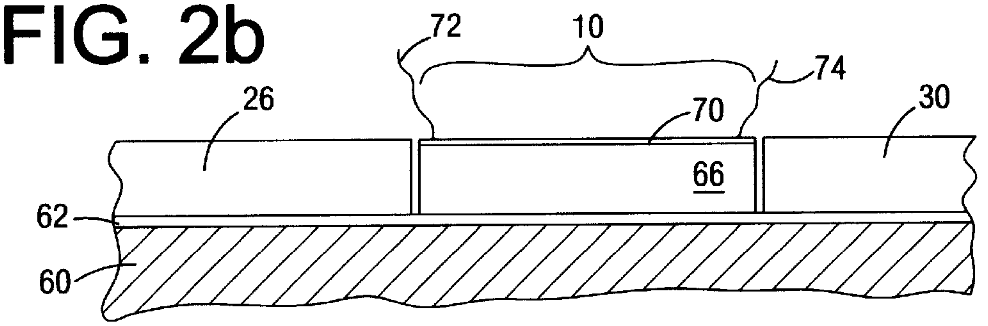

Referring now to FIGS. 2*a* and 2*b*, there is shown a perspective view and a side view, respectively, of a modulator fabricated in accordance with the method of the present invention. Reference will be specifically made to first modulator 10; however, it is understood that all statements apply equally to second modulator 12 and all other components related thereto.

First modulator 10, along with first waveguide 26 and first optical coupler 30, are all situated upon a single substrate 60. Substrate 60 could be fabricated from any number of materials including, but limited to, silica, silicon dioxide, or gallium arsenide. The desirable characteristics of substrate 60 are low coefficient of thermal expansion and good adhesion qualities, thus providing a good base upon which materials can be deposited.

Upon substrate 60 is an optical containment layer 62 which is fabricated of a material displaying the necessary characteristics to contain any optical signals within first waveguide 26, first modulator 10 and first optical coupler 30.

First waveguide 26 is shown as a single block of material. It will be understood by those skilled in the art that first waveguide 26 could take on many forms. The necessary requirements for first waveguide 26 are its ability to efficiently transmit optical signals. The optical signals carried by first waveguide 26 are then coupled into first modulator 10. In order to efficiently couple these optical signals, it is required that modulator 10 and first waveguide 26 be precisely aligned. Similar alignment is required to transmit optical signals from modulator 10 to first optical coupler 30. When dealing with optical components of the size contemplated by the present invention (i.e., a waveguide approximately 10 mils across and a modulator approximately 1–2 cm long), it is recognized that appropriate alignment can be a very tedious and difficult task.

Upon optical containment layer 62 is the structure making up first modulator 10. Directly deposited upon optical containment layer 62 is a magnetic material 66. Examples of appropriate magnetic materials are iron permalloys and garnets while it is understood that other materials exist. Magnetic material 66 must have the desired characteristic of changing its optical properties in the presence of a magnetic field.

Upon the upper surface of magnetic material 66 is deposited a metallic film 70. Metallic film 70 provides the necessary means for carrying electrical current, thus creating a magnetic field. Electrical leads 70 and 74 are connected to metallic film 70 to provide the desired electrical current, thus creating the desired magnetic fields.

Although it is not shown in FIGS. 2*a* and 2*b*, it will be understood that an overcoating could be deposited upon all exposed surfaces of first waveguide 26, modulator 10 and optical coupler 30 to provide further optical containment. To achieve this function it is necessary that the material used for the overcoating have the appropriate optical qualities, i.e., the appropriate index of refraction. Furthermore, such an overcoating will shield the waveguides and optical elements from external optical sources.

Figure 3:
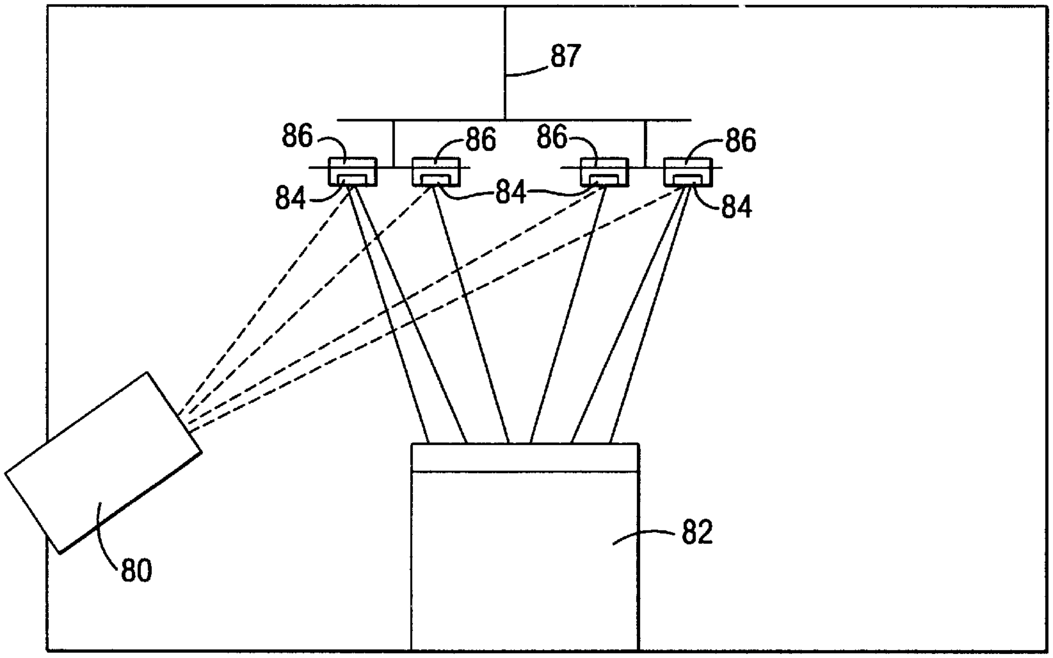
FIG. 3 is diagram illustrating the deposition system of the present invention.

The modulator shown in FIGS. 2*a* and 2*b* is manufactured by a deposition system in a coating chamber as shown in FIG. 3. The deposition technique uses a low energy ion beam means 80 along with a magnetron deposition means 82 to deposit the magnetic material on the substrates 84 held by a substrate holder 86 connected to a planet apparatus 87. The planet apparatus 87 has multiple substrate holders 86 and rotates the substrate holders 86 above the deposition source 82 as material is deposited onto the substrate 84. The planet apparatus is known in this area of technology and will not be discussed in any further detail. Further, multiple deposition sources can be used to deposit multiple layers of different materials on the substrates 84, but the detailed description will describe the use of only one deposition source as an example of the preferred embodiment.

Figure 4:
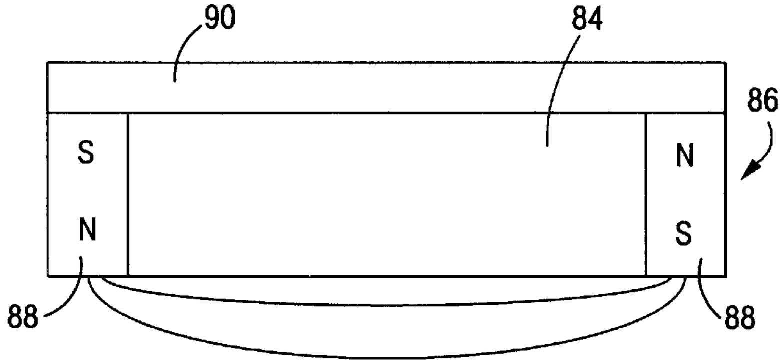
FIG. 4 shows the magnetic aligning aspect of the deposition system of the present invention.
Figure 5A:
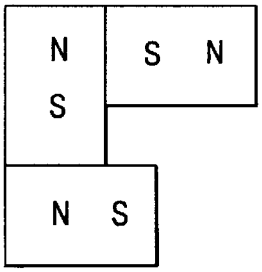
FIGS. 5*a* and 5*b* show the alignment of the material deposited using previously known methods compared to the method of the present invention.
Figure 5B:
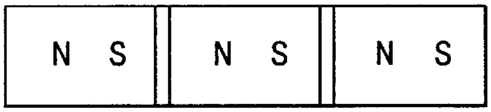

FIG. 4*a* shows the substrate holder 86 in an enlarged view. Magnets 88 connected with a pole piece 90 create a magnetic field to orient the materials deposited on the substrate 84. As stated in the background of the invention, the deposited mirrors are not optimally deposited and result in disoriented clustered deposition as seen in FIG. 5*a* which causes losses and shifts in operation. The magnetic field created by the magnets 88 cause rotation of the deposited material components so that orientation of the deposited material is optimally oriented and deposited as seen in FIG. 5*b* thus changing the optical characteristics of that material. Due to the orientation of the material, changes in optimal operation without loss and shift results.

The use of low energy ion beam deposition used in the fabrication of the modulator structure has many advantages. Of these advantages, the most important is the ability to provide the material with proper energy and time to orient and then attach optimally. Deposited magnetic materials do not usually have enough energy to orient, but attach to the substrate 84 too quickly. The low energy ion beam means 80 provides more energy to the deposited material so that the material has more time to orient properly and optimal deposition is attained. A low energy ion beam means is used since it provides just enough energy to allow the optimal orientation to be achieved, but not too much energy so that destruction of the deposited material is prevented. An example of a low energy ion beam means would be a Hall effect ion source. However, the present invention is not limited to the use of this source, but any low energy deposition means could be used in the present invention.

Another advantage of ion beam deposition is to fabricate a magnetic modulator without destroying existing structures that may exist on the substrate 60. In the present embodiment, first waveguide 26 and first optical coupler 30 already exist upon substrate 66 before magnetic modulator 10 is fabricated thereon. Using ion beam deposition allows magnetic modulator 10 to be deposited on substrate 60 without destroying the existing structures of first waveguide 26 and first optical coupler 30. Furthermore, ion bean deposition is a very efficient method by which thin films of material are fabricated. The thin films fabricated using this method replicate the target material very well and are free of impurities which may be induced by the process of fabrication. Furthermore, ion beam deposition allows the effective fabrication of a thin film of magnetic material which is not possible using other methods of deposition.

Coating chambers are known in this area of technology for depositing material on substrates. The ion beam means and magnetron deposition means are well known in this area of technology and can be interchanged with other deposition means to fulfill the spirit of the present invention. Further, magnets and pole pieces are used and described as one embodiment of the present invention. However, it is understood that many other means can be used to orient the deposited material and the magnets and pole pieces are used purely as examples of the present invention.

It will be understood by those skilled in the art that different structures can be used to fabricate a modulator which will operate similarly to that disclosed in the preferred embodiment. For example, a similar magnetic material could be used in conjunction with a dielectric mirror to form a bounce-type magnetic modulator. While the structures may vary, the principles of operation and fabrication remain the same.

Having described the present invention in considerable detail, it will be understood that the method of the present invention can be altered without departing from the scope of the present invention. We claim all modifications and alterations coming within the scope and spirit of the following claims.

The embodiments of the invention in which an exclusive property or right is claimed are defined as follows:

1. A method for fabricating a magneto-optic modulator on a substrate containing a partially fabricated ring resonator, wherein the substrate includes an optical containment layer upon which at least a waveguide portion and an optical coupler portion reside, comprising in combination:

inducing a magnetic field at a substrate holder; and depositing a magnetic material layer on the optical containment layer, wherein the magnetic material layer is deposited to be aligned between the waveguide portion and the optical coupler portion to enable efficient coupling of an optical signal.

2. The method of claim 1, further comprising applying a low energy ion beam to the magnetic material layer as the magnetic material layer is being deposited.

3. The method of claim 1, further comprising rotating the substrate holder above a deposition source as the magnetic material layer is being deposited.

4. The method of claim 1, further comprising depositing a metallic film on the magnetic material layer.

5. The method of claim 4, further comprising connecting electrical leads to the metallic film.

6. The method of claim 5, further comprising depositing an overcoating layer upon the waveguide portion, the optical coupler portion, and the magneto-optic modulator.

7. A method for fabricating a magneto-optic modulator, comprising in combination:

depositing an optical containment layer on a substrate; and depositing a magnetic material layer on the optical containment layer, wherein depositing the magnetic material layer comprises:

placing the substrate having the optical containment layer in a substrate holder;

inducing a magnetic field transversally across the substrate holder; and depositing the magnetic material layer on the optical containment layer, whereby the induced magnetic field causes rotation of components of the magnetic material layer to optimally orient the magnetic material layer.

8. The method of claim 7, wherein depositing the magnetic material layer further comprises applying a low energy ion beam to the magnetic material layer as the magnetic material layer is being deposited, thereby increasing optimal orientation of the magnetic material layer.

9. The method of claim 7, wherein depositing the optical containment layer and depositing the magnetic material layer are both performed after the substrate has been placed in the substrate holder.

10. The method of claim 7, wherein the magnetic field is induced by at least one magnet coupled to the substrate holder.

11. The method of claim 7, wherein the magnetic field is induced by two magnets coupled to the substrate holder.

12. The method of claim 7, wherein depositing the magnetic material layer further comprises rotating the substrate holder above a deposition source as the magnetic material layer is being deposited.

13. The method of claim 7, further comprising depositing a metallic film on the magnetic material layer.

14. The method of claim 13, further comprising connecting electrical leads to the metallic film.

15. A method for fabricating a magneto-optic modulator, comprising in combination:

placing a substrate in a substrate holder, wherein the substrate holder includes at least one magnet for inducing a magnetic field;

depositing an optical containment layer on the substrate;

inducing a magnetic field at the substrate holder;

depositing a magnetic material layer on the optical containment layer; and applying a low energy ion beam to the magnetic material layer as the magnetic material layer is being deposited.

16. The method of claim 15, wherein the magnetic field is induced by two magnets coupled to the substrate holder.

17. The method of claim 15, wherein depositing the magnetic material layer further comprises rotating the substrate holder above a deposition source as the magnetic material layer is being deposited.

18. The method of claim 15, further comprising depositing a metallic film on the magnetic material layer.

19. The method of claim 18, further comprising connecting electrical leads to the metallic film.

* * * * *

UNITED STATES PATENT AND TRADEMARK OFFICE

CERTIFICATE OF CORRECTION

PATENT NO. : 6,500,498 B1 
DATED : December 31, 2002
INVENTOR(S) : Ford et al.

It is certified that error appears in the above-identified patent and that said Letters Patent is hereby corrected as shown below:

<u>Column 2,</u>
Line 40, between “present” and “invention” delete “is”

<u>Column 5,</u>
Line 31, delete “bean” and insert -- beam --.

Signed and Sealed this

Twenty-eighth Day of October, 2003

JAMES E. ROGAN
*Director of the United States Patent and Trademark Office*